United States Patent
Yamamoto

(10) Patent No.: US 7,432,989 B2
(45) Date of Patent: Oct. 7, 2008

(54) TELEVISION TUNER IN WHICH UNNECESSARY RADIATION IS REDUCED

(75) Inventor: Masaki Yamamoto, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 544 days.

(21) Appl. No.: 11/167,613

(22) Filed: Jun. 27, 2005

(65) Prior Publication Data

US 2005/0287969 A1 Dec. 29, 2005

(30) Foreign Application Priority Data

Jun. 28, 2004 (JP) .............................. 2004-003760

(51) Int. Cl.
*H04N 7/00* (2006.01)

(52) U.S. Cl. ................. 348/731; 348/725; 348/733; 348/554

(58) Field of Classification Search ................ 348/731, 348/732–733, 554, 558, 725–726; 455/150.1, 455/180.1, 180.2, 188.2, 189.1, 190.1; *H04N 7/00*
See application file for complete search history.

(56) References Cited

U.S. PATENT DOCUMENTS 5,122,878 A * 6/1992 Heigl et al. ................. 348/731
5,815,218 A * 9/1998 Maeda ........................ 348/724
6,307,600 B1 * 10/2001 Wink .......................... 348/731
6,891,575 B2 * 5/2005 Matsuura .................... 348/731

FOREIGN PATENT DOCUMENTS

JP 2000-224007 8/2000
JP 2000-295539 10/2000

* cited by examiner

*Primary Examiner*—Trang U Tran
(74) *Attorney, Agent, or Firm*—Brinks Hofer Gilson & Lione

(57) ABSTRACT

A television tuner includes a first high-frequency circuit for receiving VHF-band television signals, a second high-frequency circuit for receiving UHF-band television signals, and an integrated circuit. The integrated circuit includes a first mixer, a second mixer, a first input terminal that is connected to an input terminal of the first mixer, and a second input terminal that is connected to an input terminal of the second mixer and that is adjacent to the first input terminal. The first high-frequency circuit is connected to the first input terminal, and the second high-frequency circuit is connected to the second input terminal through a switching diode. The switching diode is turned off when the VHF-band television signals are received and is turned on when the UHF-band television signals are received.

2 Claims, 3 Drawing Sheets

TELEVISION TUNER IN WHICH UNNECESSARY RADIATION IS REDUCED

This application claims the benefit of priority to Japanese Patent Application No. 2004-003760 filed on Jun. 28, 2004, herein incorporated by reference.

BACKGROUND OF THE INVENTION

1. Field of the Invention

The present invention relates to television tuners.

2. Description of the Related Art

As shown in FIG. 3, a tuner includes a UHF circuit 53, a VHF circuit 54, an integrated circuit 55, a phase locked loop (PLL) 56, a filter 57, a UHF resonant circuit 58, and a VHF resonant circuit 59. In the UHF circuit 53, a UHF antenna circuit 60, a UHF high-frequency amplifying circuit 61, and a UHF tuning circuit 62 are connected in series in this order from an input terminal 52 connected to an antenna 51. In the VHF circuit 54, a VHF antenna circuit 63, a VHF high-frequency amplifying circuit 64, and a VHF tuning circuit 65 are connected in series in this order from the input terminal 52.

The integrated circuit 55 includes a UHF mixer 66, a VHF mixer 67, a UHF local oscillator 68, a VHF local oscillator 69, a local-oscillator switching unit 70, a band-switching unit 71, and an intermediate-frequency amplifier 72.

A first input terminal of the UHF mixer 66 is connected to the output terminal of the UHF circuit 53, and a second input terminal of the UHF mixer 66 is connected to the UHF local oscillator 68. Intermediate-frequency signals from the UHF mixer 66 are output to the band-switching unit 71. A first input terminal of the VHF mixer 67 is connected to the output terminal of the VHF circuit 54, and a second input terminal of the VHF mixer 67 is connected to the VHF local oscillator 69. Intermediate-frequency signals from the VHF mixer 67 are output to the band-switching unit 71.

The intermediate-frequency signals pass through the band-switching unit 71 to be input to the filter 57. The filter 57 is a bandpass filter having steep characteristics, and the output terminal of the filter 57 is connected to the input terminal of the intermediate-frequency amplifier 72 in the integrated circuit 55. The output terminal of the intermediate-frequency amplifier 72 serves as an output terminal 73 of the tuner.

The PLL 56 applies a UHF-band switching voltage Vu for selecting a UHF band and a tuning voltage Vt corresponding to a selected channel to the UHF circuit 53. The PLL 56 applies a VHF-high-band switching voltage Vhi for selecting a VHF high band and a VHF-low-band switching voltage Vlo for selecting a VHF low band to the VHF circuit 54 and the VHF resonant circuit 59. The PLL 56 also applies the tuning voltage Vt to the VHF circuit 54. Moreover, the PLL 56 applies a control voltage to the local-oscillator switching unit 70 and the band-switching unit 71 in the integrated circuit 55. Oscillation signals from the UHF local oscillator 68 or the VHF local oscillator 69 are input to the PLL 56 through the local-oscillator switching unit 70, and the PLL 56 applies a control voltage to the UHF resonant circuit 58 and the VHF resonant circuit 59, depending on the frequency of the oscillation signals, and adjusts the oscillating frequencies of the UHF local oscillator 68 and the VHF local oscillator 69 (for example, see Japanese Unexamined Patent Application Publication No. 2000-295539, especially FIG. 3).

Since the input terminals of the two mixers are disposed close to each other in the integrated circuit, stray capacitance between the input terminals cannot be ignored. Thus, when a VHF band is received, harmonics (especially, those in the UHF band) of oscillation signals from the VHF local oscillator leak into the input terminal of the UHF mixer through the input terminal of the VHF mixer, and are further transmitted through an inactive UHF circuit in the reverse direction to be unnecessarily radiated from the antenna.

SUMMARY OF THE INVENTION

It is an object of the present invention to suppress unnecessary radiation of harmonics output from a VHF local oscillator via a UHF circuit.

To solve the problem described above, a television tuner according to the present invention includes a first high-frequency circuit for receiving VHF-band television signals, a second high-frequency circuit for receiving UHF-band television signals, and an integrated circuit. The integrated circuit includes a first mixer, a second mixer, a first input terminal that is connected to an input terminal of the first mixer, and a second input terminal that is connected to an input terminal of the second mixer and that is adjacent to the first input terminal. The first high-frequency circuit is connected to the first input terminal, and the second high-frequency circuit is connected to the second input terminal through a switching diode. The switching diode is turned off when the VHF-band television signals are received and is turned on when the UHF-band television signals are received.

Thus, in a case where the VHF-band television signals are received, even when harmonics from a first oscillator reach the switching diode through the first mixer, the first input terminal, and the second input terminal, the harmonics are blocked at the switching diode. Thus, the harmonics are not transmitted through the second high-frequency circuit in the reverse direction.

The second mixer may be a balanced mixer. The integrated circuit may further include another second input terminal, which forms a pair of second input terminals together with the second input terminal described above. A balanced/unbalanced conversion circuit functioning as a series circuit including an inductive element and a capacitive element may extend between an output terminal of the second high-frequency circuit and ground. The output terminal of the second high-frequency circuit may be connected to one of the second input terminals near the first input terminal through the switching diode. A node between the inductive element and the capacitive element may be connected to the other of the second input terminals. The integrated circuit may include first and second transistors that are turned on and off. Bases of these transistors are connected to each other. The collector of the first transistor may be pulled up to a power supply. The emitter of the first transistor may be connected to the other second input terminal through a first resistor and may be grounded through a first high-resistance resistor. The emitter of the second transistor may be grounded. The collector of the second transistor may be connected to the one second input terminal through a second resistor and may be pulled up to the power terminal through a second high-resistance resistor.

Thus, a sufficient reverse-bias voltage can be applied when the switching diode is turned off, and the forward current for turning on the switching diode can be readily controlled by the first and second resistors.

Current running through the switching diode in the on state may have an amplitude of 0.01 to 0.5 mA.

Thus, the frequency response depending on the balanced/unbalanced conversion circuit can be flattened.

DESCRIPTION OF THE PREFERRED EMBODIMENTS

Figure 1:
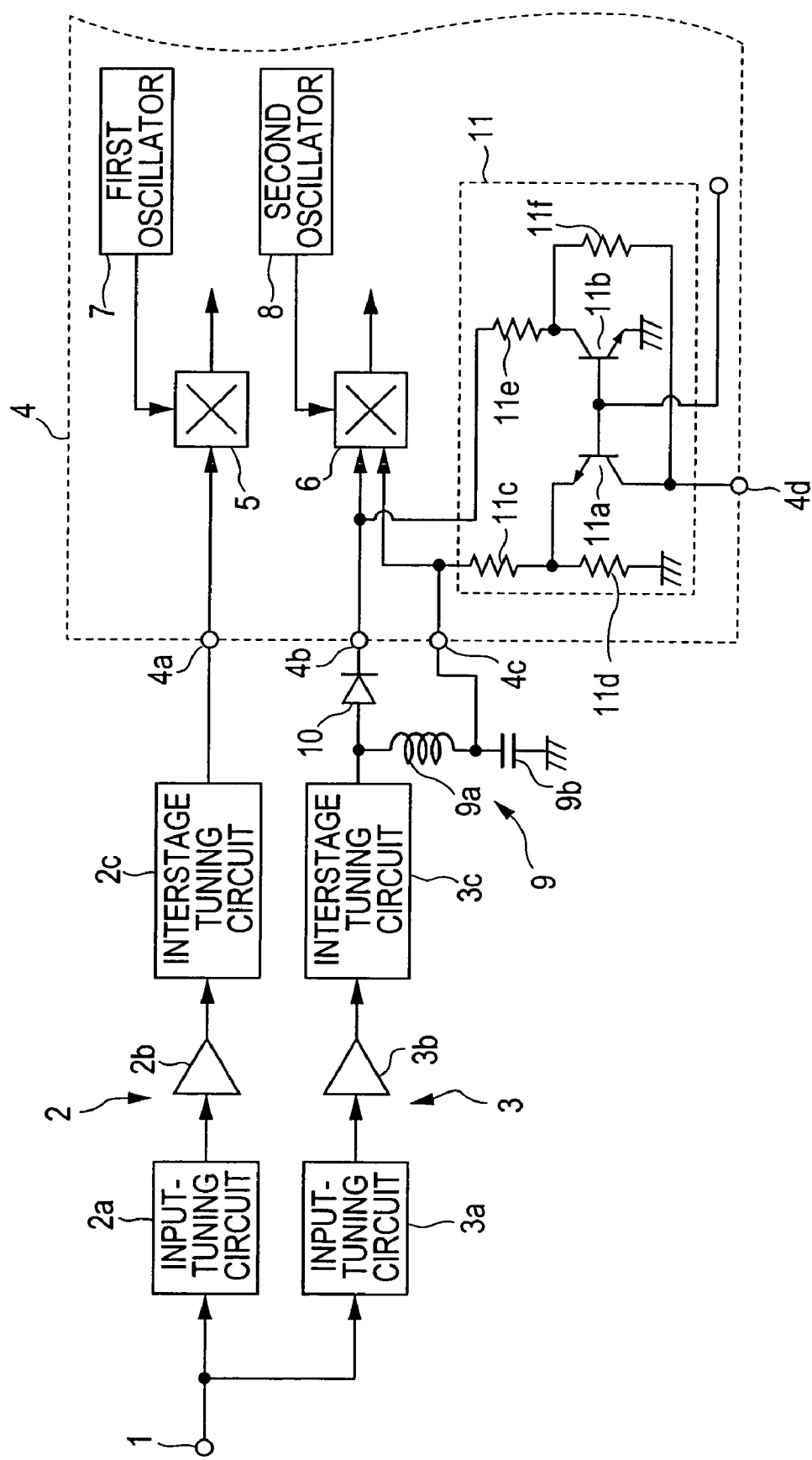
FIG. 1 is a circuit diagram showing the structure of a television tuner according to the present invention.

FIG. 1 shows the structure of a television tuner according to the present invention. A first high-frequency circuit 2 for receiving VHF-band television signals and a second high-frequency circuit 3 for receiving UHF-band television signals are connected to an input terminal 1.

The first high-frequency circuit 2 includes an input-tuning circuit 2a in the first stage, a high-frequency amplifier 2b, and an interstage tuning circuit 2c connected in series. The second high-frequency circuit 3 includes an input-tuning circuit 3a in the first stage, a high-frequency amplifier 3b, and an interstage tuning circuit 3c connected in series. These circuits are unbalanced circuits.

An integrated circuit 4 includes a first mixer 5 for converting VHF-band television signals to intermediate-frequency signals, a second mixer 6 for converting UHF-band television signals to intermediate-frequency signals, a first oscillator 7, a second oscillator 8, a switching circuit 11, a first input terminal 4a connected to an input terminal of the first mixer 5, a pair of second input terminals 4b and 4c connected to the second mixer 6, a power terminal 4d, and a band decoder (not shown). The second mixer 6 is a balanced mixer. Local oscillation signals are supplied to the mixers 5 and 6 from the first oscillator 7 and the second oscillator 8, respectively. The second input terminal 4b is adjacent to the first input terminal 4a.

A balanced/unbalanced conversion circuit 9 extends between the output terminal of the interstage tuning circuit 3c in the second high-frequency circuit 3 and ground. The balanced/unbalanced conversion circuit 9 is a series circuit including an inductive element 9a and a capacitive element 9b. The inductive element 9a is disposed at the side of the interstage tuning circuit 3c, and the capacitive element 9b at the side of the ground.

The output terminal of the interstage tuning circuit 2c in the first high-frequency circuit 2 is connected to the first input terminal 4a. The output terminal of the interstage tuning circuit 3c in the second high-frequency circuit 3 is connected to the second input terminal 4b through a switching diode 10. The node between the inductive element 9a and the capacitive element 9b is connected to the second input terminal 4c.

The on/off operation of the switching diode 10 is controlled by the switching circuit 11. The switching circuit 11 includes a first transistor 11a, a second transistor 11b, a first resistor 11c, a first high-resistance resistor 11d, a second resistor 11e, and a second high-resistance resistor 11f. The base of the first transistor 11a is connected to that of the second transistor 11b. The collector of the first transistor 11a is pulled up to the power terminal 4d, and the emitter of the first transistor 11a is connected to the second input terminal 4c through the first resistor 11c and to ground through the first high-resistance resistor 11d.

The emitter of the second transistor 11b is grounded, and the collector of the second transistor 11b is connected to the second input terminal 4b through the second resistor 11e and is pulled up to the power terminal 4d through the second high-resistance resistor 11f. A switching voltage for turning on and off the first transistor 11a and the second transistor 11b is supplied from the band decoder to the bases of these transistors.

In the structure described above, when VHF-band television signals are received, the first high-frequency circuit 2 is activated and the second high-frequency circuit 3 is deactivated. The first transistor 11a and the second transistor 11b are turned off. In this state, the switching diode 10 is turned off because it is reverse-biased by the second high-resistance resistor 11f, the second resistor 11e, the inductive element 9a, the first resistor 11c, and the first high-resistance resistor 11d. Even when harmonics from the first oscillator 7 reach the switching diode 10 through the first mixer 5, the first input terminal 4a, and the second input terminal 4b, the harmonics are blocked at the switching diode 10. Thus, the harmonics are not transmitted through the second high-frequency circuit 3 in the reverse direction.

On the other hand, when UHF-band television signals are received, the first high-frequency circuit 2 is deactivated and the second high-frequency circuit 3 is activated. The first transistor 11a and the second transistor 11b are turned on. In this state, a forward current runs through the switching diode 10 via the first transistor 11a, the first resistor 11c, the inductive element 9a, the second resistor 11e, and the second transistor 11b, and the switching diode 10 is turned on.

Though the output terminal of the interstage tuning circuit 3c in the second high-frequency circuit 3 is unbalanced, the series resonant frequency of the balanced/unbalanced conversion circuit 9 is lower than the frequency of television signals, and television signals in opposite phase appear at the node between the inductive element 9a and the capacitive element 9b. Thus, balanced television signals are output between the second input terminals 4b and 4c.

The frequency response of the balanced television signals, which appear between the second input terminals 4b and 4c, increases as the frequency decreases depending on the characteristics of the balanced/unbalanced conversion circuit 9. The frequency response can be flattened by dampening the resonant Q of the balanced/unbalanced conversion circuit 9 by the equivalent resistance of the switching diode 10 in the on state.

Figure 2:
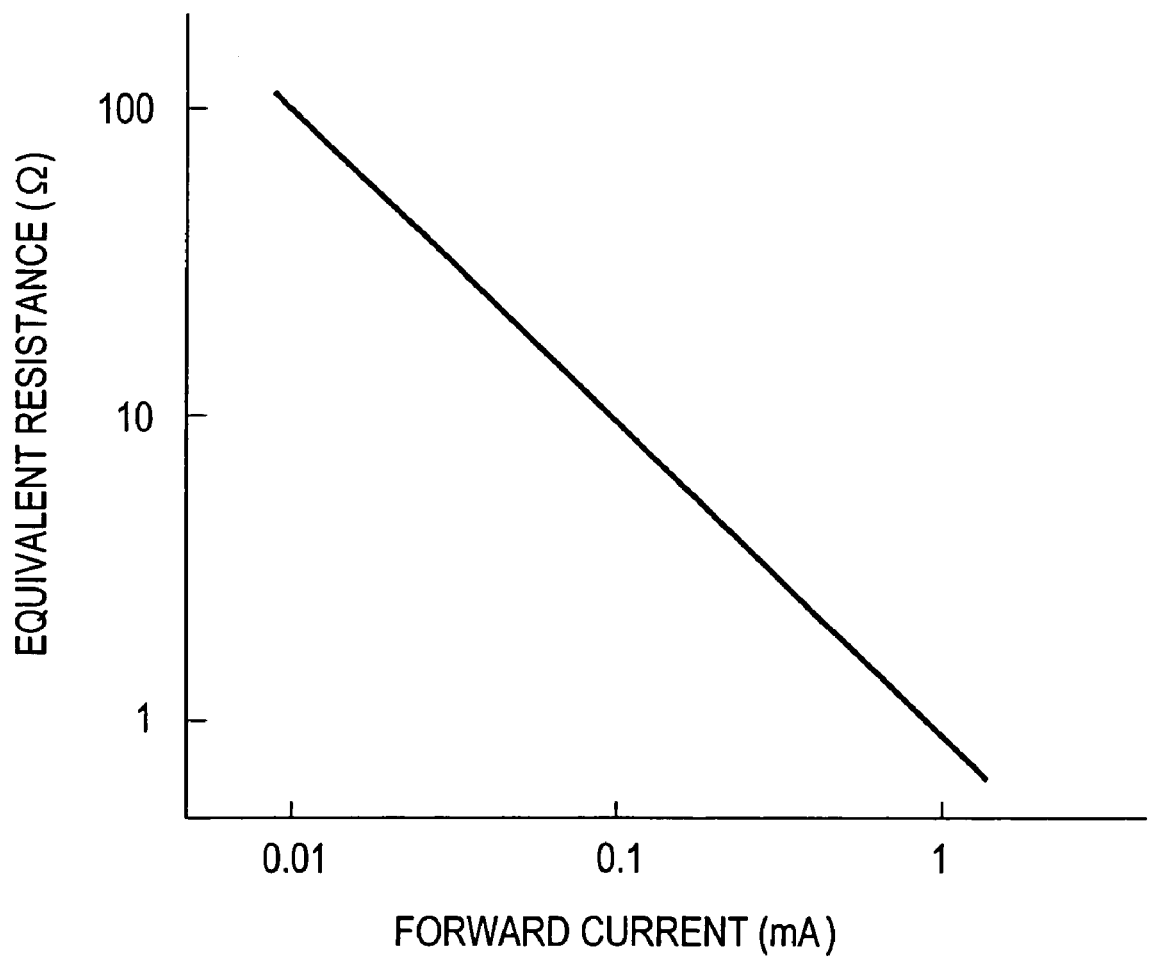
FIG. 2 is a characteristic diagram of equivalent resistance of a switching diode used in the television tuner according to the present invention.
Figure 3:
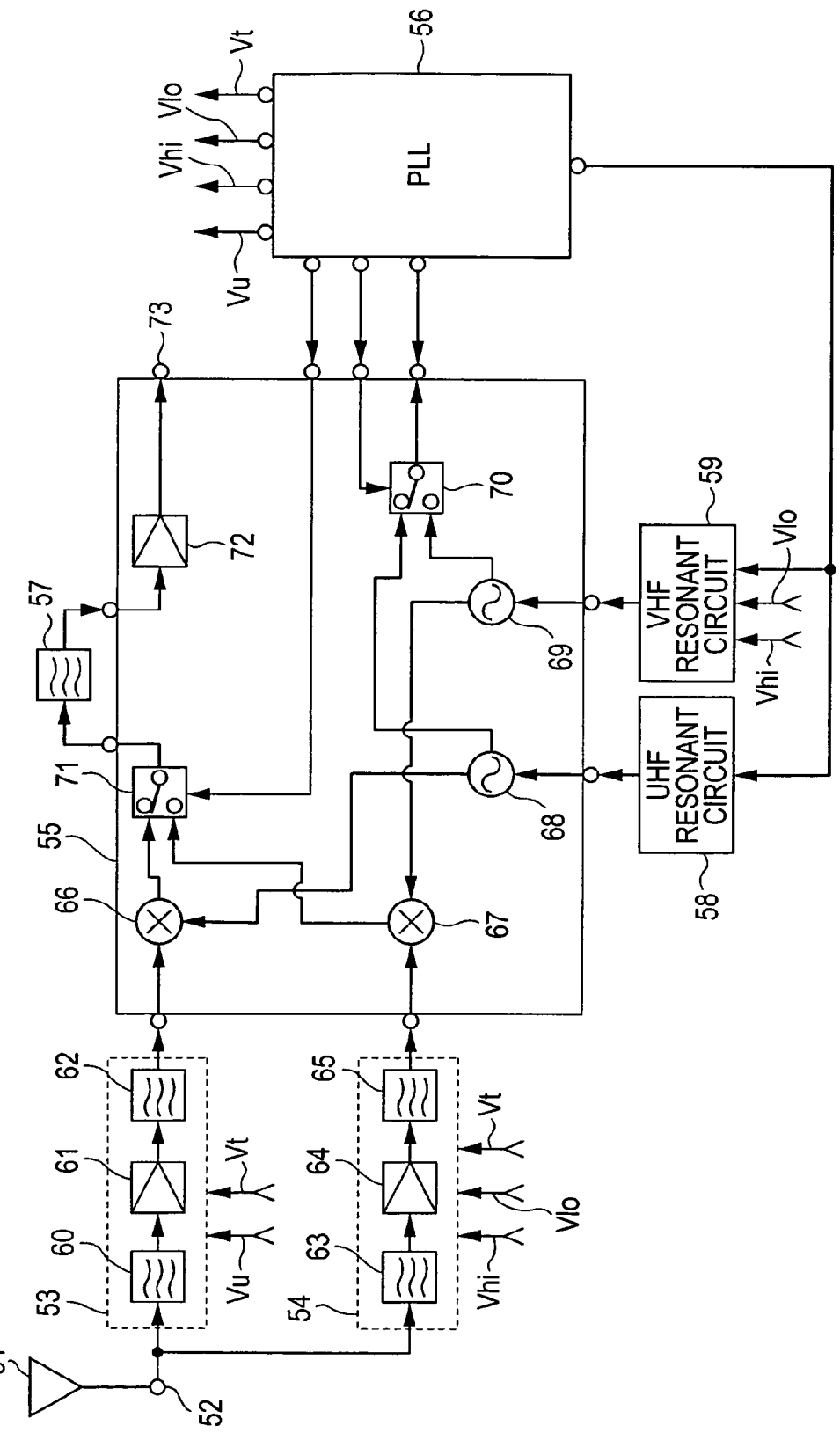
FIG. 3 is a circuit diagram showing the structure of a known television tuner.

FIG. 2 shows the relationship between forward current and equivalent resistance. An equivalent resistance of about 1 Ω corresponds to a forward current of 1 mA, about 10 Ω to 0.1 mA, and about 100 Ω to 0.01 mA. A resistance of several to several tens of ohms is needed in order to dampen the Q. When the current running through the switching diode 10 is controlled by the first resistor 11c and the second resistor 11e so as to have an amplitude of about 0.01 to 0.5 mA, the frequency response of the balanced signals can be flattened by the switching diode 10.

What is claimed is:

1. A television tuner comprising:
    a first high-frequency circuit for receiving VHF-band television signals;
    a second high-frequency circuit for receiving UHF-band television signals; and
    an integrated circuit comprising:
        a first mixer;
        a second mixer;
        a first input terminal that is connected to an input terminal of the first mixer; and
        a second in put terminal that is connected to an input terminal of the second mixer and that is adjacent to the first input terminal, wherein the first high-frequency circuit is connected to the first input terminal, and the second high-frequency circuit is connected to the second input terminal through a switching diode, the switching diode being turned off when the VHF-band television signals are received and being turned on when the UHF-band television signals are received, wherein the second mixer is a balanced mixer, the integrated circuit further comprises another second input terminal, which forms a pair of second input terminals together with said second input terminal, a balanced/unbalanced conversion circuit functioning as a series circuit including an inductive element and a capacitive element extends between an output terminal of the second high-frequency circuit and ground, the output terminal of the second high-frequency circuit is connected to one of the second input terminals near the first input terminal through the switching diode, a node between the inductive element and the capacitive element is connected to the other of the second input terminals, the integrated circuit includes first and second transistors that are turned on and off, bases of the transistors being connected to each other, a collector of the first transistor is pulled up to a power supply, an emitter of the first transistor is connected to the other second input terminal through a first resistor and is grounded through a first high-resistance resistor, an emitter of the second transistor is grounded, and a collector of the second transistor is connected to the one second input terminal through a second resistor and is pulled up to the power terminal through a second high-resistance resistor.

2. The television tuner according to claim 1, wherein current running through the switching diode in the on state has an amplitude of 0.01 to 0.5 mA.

* * * * *